United States Patent
Souchkov

(10) Patent No.: US 8,508,502 B2
(45) Date of Patent: Aug. 13, 2013

(54) CAPACITIVE TOUCHSCREEN SYSTEM WITH TOUCH POSITION ENCODING DURING ANALOG-TO-DIGITAL CONVERSION

(75) Inventor: Vitali Souchkov, Walnut Creek, CA (US)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 523 days.

(21) Appl. No.: 12/916,567

(22) Filed: Oct. 31, 2010

(65) Prior Publication Data
US 2012/0105355 A1    May 3, 2012

(51) Int. Cl.
*G06F 3/045* (2006.01)

(52) U.S. Cl.
USPC ............ 345/174; 178/18.06; 178/18.01; 178/19.03; 345/173; 345/156

(58) Field of Classification Search
None
See application file for complete search history.

(56) References Cited

U.S. PATENT DOCUMENTS

| | | | |
|---|---|---|---|
| 6,297,811 B1 | 10/2001 | Kent et al. | |
| 7,176,897 B2 | 2/2007 | Roberts | |
| 2003/0067451 A1 | 4/2003 | Tagg et al. | |
| 2006/0097991 A1 | 5/2006 | Hotelling et al. | |
| 2007/0074913 A1 | 4/2007 | Geaghan et al. | |
| 2009/0032312 A1* | 2/2009 | Huang et al. | 178/18.06 |
| 2010/0328295 A1* | 12/2010 | Piasecki et al. | 345/212 |
| 2011/0084936 A1* | 4/2011 | Chang et al. | 345/174 |
| 2011/0157077 A1* | 6/2011 | Martin et al. | 345/174 |
| 2011/0267287 A1* | 11/2011 | Bartling et al. | 345/173 |

* cited by examiner

*Primary Examiner* — James Wozniak
*Assistant Examiner* — Yaron Cohen
(74) *Attorney, Agent, or Firm* — Winston Hsu; Scott Margo

(57) ABSTRACT

Disclosed herein are various embodiments of circuits and methods in a capacitive touchscreen system that eliminate the need to digitize an entire array of pixel signals obtained from a touchscreen. Instead, regions of interest, or projections of object or touch signal clusters, from touchscreen 90 are employed to encode the coordinates or positions of objects or touches in an analog-to-digital converter (ADC). Encoding of object positions occurs during digitization of the analog signal clusters, which eliminates the need to separately digitize individual touchscreen signals. The disclosed circuits and methods reduce the number of signal processor channels that might otherwise be required, and lead to power consumption reduction in the capacitive touchscreen system, as well as in reducing the area required to implement the circuit architecture in an integrated circuit.

26 Claims, 7 Drawing Sheets

CAPACITIVE TOUCHSCREEN SYSTEM WITH TOUCH POSITION ENCODING DURING ANALOG-TO-DIGITAL CONVERSION

FIELD OF THE INVENTION

Various embodiments of the invention described herein relate to the field of capacitive sensing input devices generally, and more specifically to means and methods of encoding touch or object positions during analog-to-digital conversion.

BACKGROUND

Two principal capacitive sensing and measurement technologies are currently employed in most touchpad and touchscreen devices. The first such technology is that of self-capacitance. Many devices manufactured by SYNAPTICS™ employ self-capacitance measurement techniques, as do integrated circuit (IC) devices such as the CYPRESS PSOC.™ Self-capacitance involves measuring the self-capacitance of a series of electrode pads using techniques such as those described in U.S. Pat. No. 5,543,588 to Bisset et al. entitled "Touch Pad Driven Handheld Computing Device" dated Aug. 6, 1996.

Self-capacitance may be measured through the detection of the amount of charge accumulated on an object held at a given voltage (Q=CV). Self-capacitance is typically measured by applying a known voltage to an electrode, and then using a circuit to measure how much charge flows to that same electrode. When external objects are brought close to the electrode, additional charge is attracted to the electrode. As a result, the self-capacitance of the electrode increases. Many touch sensors are configured such that the grounded object is a finger. The human body is essentially a capacitor to a surface where the electric field vanishes, and typically has a capacitance of around 100 pF.

Electrodes in self-capacitance touchpads are typically arranged in rows and columns. By scanning first rows and then columns the locations of individual disturbances induced by the presence of a finger, for example, can be determined. To effect accurate multi-touch measurements in a touchpad, however, it may be required that several finger touches be measured simultaneously. In such a case, row and column techniques for self-capacitance measurement can lead to inconclusive results.

One way in which the number of electrodes can be reduced in a self-capacitance system is by interleaving the electrodes in a saw-tooth pattern. Such interleaving creates a larger region where a finger is sensed by a limited number of adjacent electrodes allowing better interpolation, and therefore fewer electrodes. Such patterns can be particularly effective in one dimensional sensors, such as those employed in IPOD click-wheels. See, for example, U.S. Pat. No. 6,879,930 to Sinclair et al. entitled Capacitance touch slider dated Apr. 12, 2005.

The second primary capacitive sensing and measurement technology employed in touchpad and touchscreen devices is that of mutual capacitance, where measurements are performed using a crossed grid of electrodes. See, for example, U.S. Pat. No. 5,861,875 to Gerpheide entitled "Methods and Apparatus for Data Input" dated Jan. 19, 1999. Mutual capacitance technology is employed in touchpad devices manufactured by CIRQUE.™ In mutual capacitance measurement, capacitance is measured between two conductors, as opposed to a self-capacitance measurement in which the capacitance of a single conductor is measured, and which may be affected by other objects in proximity thereto.

In some mutual capacitance measurement systems, an array of sense electrodes is disposed on a first side of a substrate and an array of drive electrodes is disposed on a second side of the substrate that opposes the first side, a column or row of electrodes in the drive electrode array is driven to a particular voltage, the mutual capacitance to a single row (or column) of the sense electrode array is measured, and the capacitance at a single row-column intersection is determined. By scanning all the rows and columns a map of capacitance measurements may be created for all the nodes in the grid. When a user's finger or other electrically conductive object approaches a given grid point, some of the electric field lines emanating from or near the grid point are deflected, thereby decreasing the mutual capacitance of the two electrodes at the grid point. Because each measurement probes only a single grid intersection point, no measurement ambiguities arise with multiple touches as in the case of some self-capacitance systems. Moreover, it is possible to measure a grid of m×n intersections with only m+n pins on an IC.

It is well known that capacitive touchscreen systems, owing to their frequent use in battery-operated mobile electronic devices, present formidable challenges to reducing the power consumption thereof. It is also well known that there is significant market pressure to miniaturize and make ever smaller such mobile electronic devices and the components from which they are made.

What is needed is a capacitive touchscreen system that features reduced power consumption, and that can be made smaller.

SUMMARY

In one embodiment, there is a provided a capacitive touchscreen system comprising a touchscreen comprising a first plurality of electrically conductive drive traces and a second plurality of electrically conductive sense traces, mutual capacitances existing between the first and second pluralities of traces at locations where the first and second pluralities of traces intersect to form pixels, such mutual capacitances changing in the presence of one or more fingers or touch devices brought into proximity thereto, drive circuitry operably connected to the first plurality of drive traces, sense circuitry operably connected to the second plurality of sense traces and comprising charge acquisition circuitry, the sense circuitry being configured to sense the mutual capacitances along each of the second plurality of sense traces and to generate a plurality of sense voltages corresponding to the sense traces, a plurality of comparators configured to receive as inputs thereto a threshold voltage and the sense voltages, the comparators providing comparator output signals, an analog multiplexer having as a first input thereto the sense voltages, a plurality of logical AND gates configured to receive as inputs thereto the comparator output signals and to provide as outputs therefrom logical AND output signals, the AND output signals being inputs to a digital multiplexer operably connected to the outputs of the plurality of logical AND gates, the analog multiplexer receiving as a digital input thereto a digital output of the digital multiplexer, a first sum circuit configured to receive as an input thereto an output from the analog multiplexer and to provide as an output therefrom an analog-to-digital converter (ADC) reference voltage representing a sum of the sense voltages corresponding to at least one cluster of pixels associated with at least one sensed touch on the touchscreen, a second weighted sum circuit configured to receive as an input thereto the output from the analog multiplexer and to provide as an output therefrom an input to the ADC representing a weighted sum of the sense voltages corresponding to pixels of the cluster; wherein the outputs of the comparators and the AND gates represent at least one cluster of pixels corresponding to at least one sensed touch on the touchscreen, the output of the second weighted sum circuit represents a weighted sum of the sense voltages corresponding to pixels of the cluster, and the ADC generates as an output therefrom a position code corresponding to an interpolated location of the sensed finger or device touch.

In another embodiment, there is provided a method of encoding detected touch or object positions in an analog-to-digital converter (ADC) included in a capacitive touchscreen system comprising providing drive signals to a first plurality of electrically conductive drive traces, a second plurality of electrically conductive sense traces being located in proximity to the first plurality of drive traces such that mutual capacitances are developed between the first and second pluralities of traces at locations where the first and second pluralities of traces intersect to form pixels, such mutual capacitances changing in the presence of one or more fingers or touch devices brought into proximity thereto, sensing of the mutual capacitances along each of the second plurality of sense traces and generating a plurality of sense voltages corresponding to each of the sense traces, providing a threshold voltage and the sense voltages to a plurality of comparators as inputs thereto, the comparators providing comparator output signals, the comparators receiving the input sense voltages as multiplexed input signals under the control of a first multiplexer operably connected to the plurality of comparators, providing the comparator output signals to a plurality of AND gates configured as inputs thereto and generating as outputs from the AND gates AND output signals, the AND output signals being multiplexed under control of a second multiplexer operably connected to the outputs of the plurality of AND gates, the first multiplexer receiving as an input thereto an output of the second multiplexer, providing to a first sum circuit as an input thereto an output from the first multiplexer, the first sum circuit generating as an output therefrom an ADC reference voltage, providing to a second weighted sum circuit as an input thereto the output from the first multiplexer and generating as an output therefrom an input to the ADC, wherein the outputs of the comparators and the AND gates represent at least one cluster of pixels corresponding to at least one sensed finger or device touch on the touchscreen, the output of the second weighted sum circuit represents a weighted sum of the sense voltages corresponding to pixels of the cluster, the ADC generating as an output therefrom a position code corresponding to an interpolated location of the sensed object or touch.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings.

DETAILED DESCRIPTIONS OF SOME EMBODIMENTS

Figure 1:
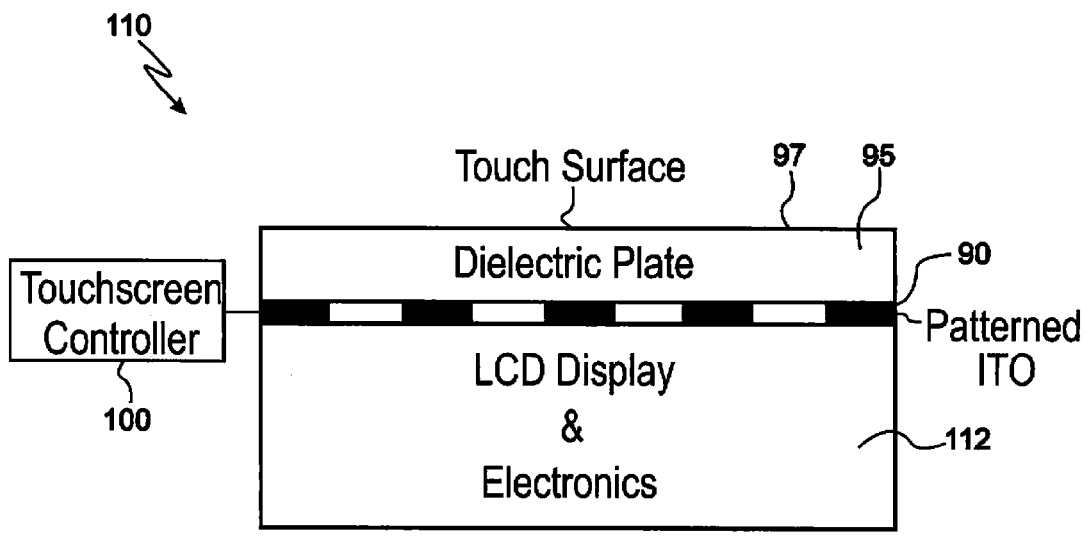
FIG. 1 shows a cross-sectional view of one embodiment of a capacitive touchscreen system.

As illustrated in FIG. 1, a capacitive touchscreen system 110 typically consists of an underlying LCD or OLED display 112, an overlying touch-sensitive panel or touchscreen 90, a protective cover or dielectric plate 95 disposed over the touchscreen 90, and a touchscreen controller, micro-processor, application specific integrated circuit ("ASIC") or CPU 100. Note that image displays other than LCDs or OLEDs may be disposed beneath display 112.

Figure 2:
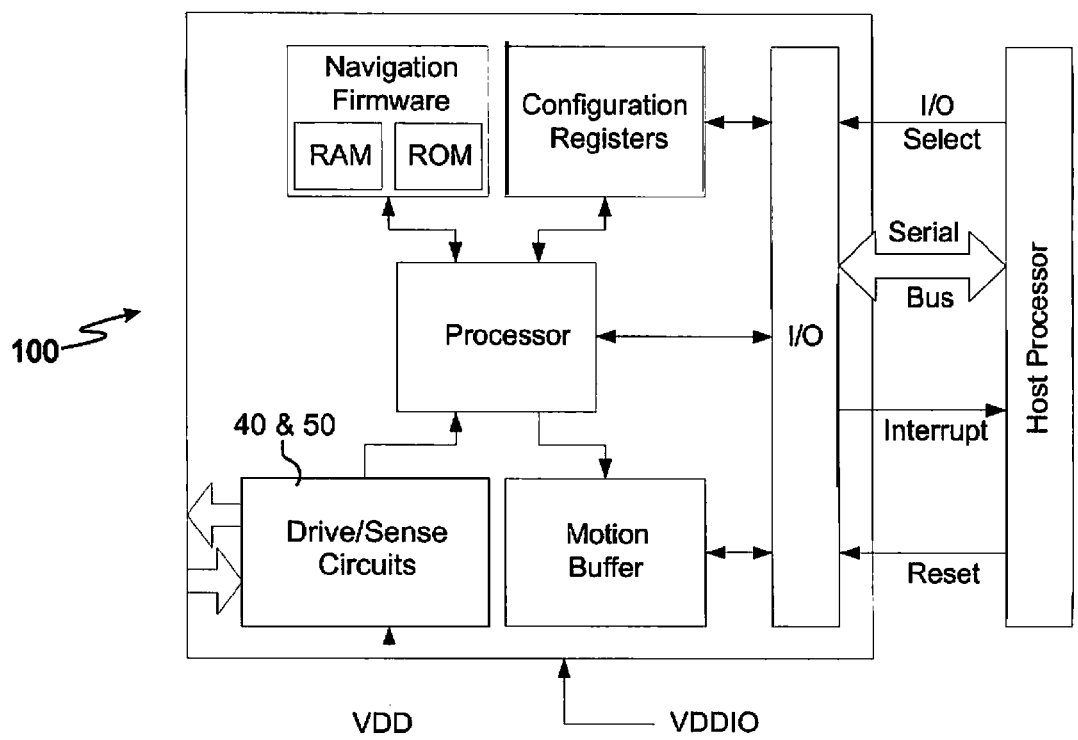
FIG. 2 shows a block diagram of a capacitive touchscreen controller.

FIG. 2 shows a block diagram of one embodiment of a touchscreen controller 100. In one embodiment, touchscreen controller 100 may be an Avago Technologies™ AMRI-5000 ASIC or chip 100 modified in accordance with the teachings presented herein. In one embodiment, touchscreen controller is a low-power capacitive touch-panel controller designed to provide a touchscreen system with high-accuracy, on-screen navigation.

Figure 3:
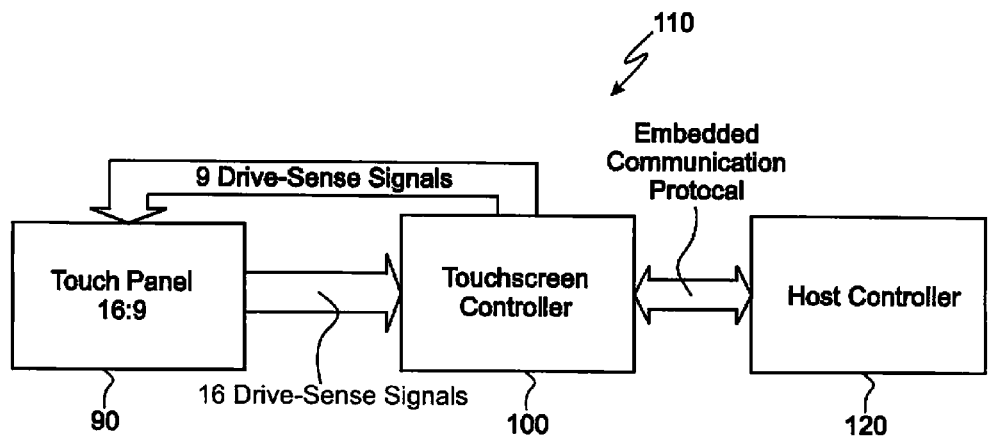
FIG. 3 shows one embodiment of a block diagram of a capacitive touchscreen system and a host controller.
Figure 4:
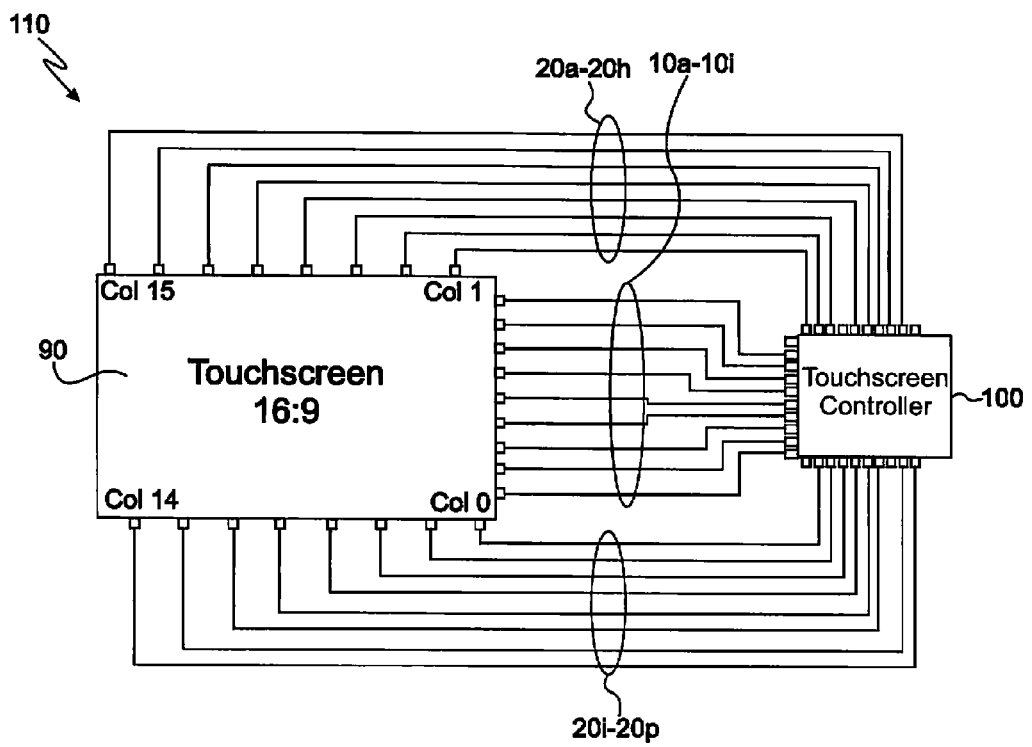
FIG. 4 shows a schematic block diagram of one embodiment of a capacitive touchscreen system.

Capacitive touchscreens or touch panels 90 shown in FIGS. 3 and 4 can be formed by applying a conductive material such as Indium Tin Oxide (ITO) to the surface(s) of a dielectric plate, which typically comprises glass, plastic or another suitable electrically insulative and preferably optically transmissive material, and which is usually configured in the shape of an electrode grid. The capacitance of the grid holds an electrical charge, and touching the panel with a finger presents a circuit path to the user's body, which causes a change in the capacitance.

Touchscreen controller 100 senses and analyzes the coordinates of these changes in capacitance. When touchscreen 90 is affixed to a display with a graphical user interface, on-screen navigation is possible by tracking the touch coordinates. Often it is necessary to detect multiple touches. The size of the grid is driven by the desired resolution of the touches. Typically there is an additional cover plate 95 to protect the top ITO layer of touchscreen 90 to form a complete touch screen solution (see, e.g., FIG. 1).

One way to create a touchscreen 90 is to apply an ITO grid on one side only of a dielectric plate or substrate. When the touchscreen 90 is mated with a display there is no need for an additional protective cover. This has the benefit of creating a thinner display system with improved transmissivity (>90%), enabling brighter and lighter handheld devices. Applications for touchscreen controller 100 include, but are not limited to, smart phones, portable media players, mobile internet devices (MIDs), and GPS devices.

Referring now to FIGS. 3 and 4, in one embodiment the touchscreen controller 100 includes an analog front end with 9 sense and drive signal lines and 16 drive and sense lines connected to an ITO grid on a touchscreen. Touchscreen controller 100 applies an excitation such as a square wave, meander signal or other suitable type of drive signal to the drive electrodes that may have a frequency selected from a range between about 40 kHz and about 200 kHz. The AC signal is coupled to the sense lines via mutual capacitance. Touching panel 90 with a finger alters the capacitance at the location of the touch. Touchscreen controller 100 can resolve and track multiple touches simultaneously. A high refresh rate allows the host to track rapid touches and any additional movements without appreciable delay. The embedded processor filters the data, identifies the touch coordinates and reports them to the host. The embedded firmware can be updated via patch loading. Other numbers of drive and sense lines are of course contemplated, such as 8×12 and 12×20 arrays.

Touchscreen controller 100 can feature multiple operating modes with varying levels of power consumption. In rest mode controller 100 periodically looks for touches at a rate programmed by the rest rate registers. There are multiple rest modes, each with successively lower power consumption. In the absence of a touch for a certain interval controller 100 may automatically shift to the next-lowest power consumption mode. However, as power consumption is reduced the response time to touches typically increases.

According to one embodiment, and as shown in FIG. 4, an ITO grid on the touchscreen 90 comprises rows 20a-20p (or Y lines 1-16) and columns 10a-10i (or X lines 1-9), where rows 20a-20p are operably connected to drive circuits 40 and columns 10a-10i are operably connected to sense circuits 50. One configuration for routing ITO drive and sense lines to touchscreen controller 100 is shown in FIG. 4.

Note that the rows in a touchscreen may be configured to operate as sense lines, and the columns in a touchscreen may be configured to operate as drive lines. Drive lines may also be selectably switched to operate as sense lines, and sense lines may be selectably switched to operate as drive lines under the control of appropriate multiplexing and control circuitry. Moreover, drive and sense lines may be configured in patterns other than rows and columns, or other than orthogonal rows and columns. Those skilled in the art will understand that touchscreen controllers, micro-processors, ASICs or CPUs other than a modified AMRI-5000 chip or touchscreen controller 100 may be employed in touchscreen system 110, and that different numbers of drive and sense lines, and different numbers and configurations of drive and sense electrodes, other than those explicitly shown herein may be employed without departing from the scope or spirit of the various embodiments of the invention.

In one embodiment, the angle between traces 10 and 20 is about 90 degrees (as shown, for example in FIG. 4), but may be any suitable angle such as, by way of example, about 15 degrees, about 30 degrees, about 45 degrees, about 60 degrees, or about 75 degrees. Electrically conductive traces 10 and 20 may be disposed in substantially parallel but vertically-offset first and second planes, respectively, or may be disposed in substantially the same plane. In one embodiment, electrically conductive traces 10a-10i and 20a-20p comprise indium tin oxide ("ITO"), or any other suitable electrically conductive material. A liquid crystal display may be disposed beneath electrically conductive traces 10a-10i and 20a-20p, or any other suitable image display. Electrically conductive traces 10a-10i and 20a-20p are preferably disposed on a substrate comprising an electrically insulative material that is substantially optically transparent.

Note that touchscreen system 110 may be incorporated into or form a portion of an LCD, a computer display, a laptop computer, a personal data assistant (PDA), a mobile telephone, a radio, an MP3 player, a portable music player, a stationary device, a television, a stereo, an exercise machine, an industrial control, a control panel, an outdoor control device, a household appliance, or any other suitable electronic device.

The most common design implementation of touchscreens with arrays of capacitive sensors employs sets of electrodes disposed along orthogonal axes. Numerous variations of touchscreen electrode designs exist which permit capacitive coupling of electrodes to achieve desirable signal characteristics. When charging electric potential is applied to one set of electrodes, disposed for instance along an X axis, the cross coupled capacitance at the overlap regions to the electrodes disposed along an orthogonal Y axis is changed due to object presence at the sensor panel. This allows detection the object position by processing the electric charge signals acquired at electrodes by charging the electrode capacitances to a known electric potential. In a time multiplexing method, the object position in one of two coordinates on touchscreen 90 is determined by the coordinate of a line connected to a drive potential, one line at a time. Alternatively, in frequency multiplexing or coded time sequence modulation methods, the drive line signal may be coded using a selected method of drive signal modulation, where all lines belonging to one set of electrodes may be driven simultaneously and the position of a particular line being driven is decoded in the readout circuitry after the acquired signal has been demodulated.

In capacitive sensor arrays or touchscreens, charge acquisition circuitry acquires electric charges (which is determined by the electrode capacitances). While one of the above sets of electrodes is charged, charge signals are acquired from another generally orthogonal set of electrodes, which results in the formation of a projection of the signals from touchscreen 90 reflecting the number and position of the lines or electrodes pertaining to the electrode set that is being charged. A projection along the direction of the orthogonal lines may be obtained by repeating charge acquisition using multiplexed sets of drive and acquisition lines or electrodes.

In the circuit architecture disclosed below, digitization of the entire array of pixel signals from touchscreen 90 is replaced by the digitizing regions of interest, or projections of touch signal clusters, in touchscreen 90 by encoding touch coordinates through the use of an analog-to-digital converter (ADC) as a position encoding module. Encoding of object position occurs during digitization of the analog signal clusters, which eliminates the need to separately digitize individual touchscreen signals. This circuit architecture described below reduces the number of signals required for further digital signal filtering and processing. The readout of the touchscreen that is provided reduces the number of signal processor channels that would otherwise be required, and results in both a reduction of power consumption for the capacitive touchscreen system, and in a reduction of the area required to implement the circuit architecture on silicon in an integrated circuit.

The Position Encoding Principle

Pixels on touchscreen 90 corresponding to existing touch signals may be selected using a threshold technique while the acquired signals exist in analog form. For instance, if a cluster of touched pixels is 3×3 pixels, then each projection has 3 signals, the number of signals to be processed for the selected cluster is 6, and the whole cluster represents 9 separate signals. Although touches represented by a pixel cluster of 3×3 pixels are often the most practical to implement, the devices and methods disclosed herein may be applied to a pixel cluster of any appropriate size.

Figure 5:
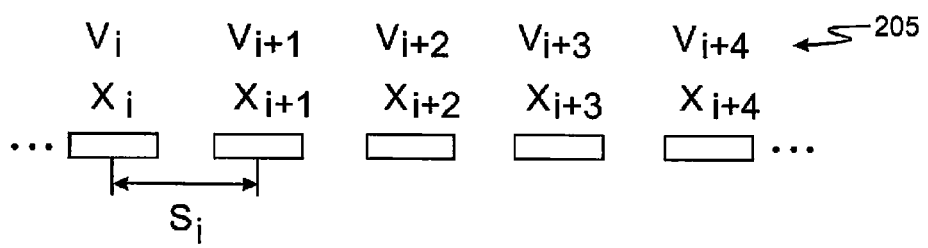
FIG. 5 shows X-coordinate positions and input voltages corresponding thereto.

Consider first a one dimensional array of pixels or sensors located at positions Xi, where signals Vi are acquired at one time, where pixels Xi+1 and Xi are separated by distance Si as shown in FIG. 5.

While details of signal distributions induced by a touch object such as a human finger or stylus presented to the pixel or sensor array may not be known, a center of gravity algorithm may be successfully used to determine the center of a touch. In one embodiment, a center of gravity algorithm may be formally expressed as follows:

$$X_C = \frac{\sum_{i=1}^{N} V_i X_i}{\sum_{i=1}^{N} V_i} \quad (1)$$

where Xc is a position estimate of the object provided by the algorithm of equation (1), and the Xi positions of sensors Vi represent the acquired sensor or pixel signals (which normally appears as voltage across a capacitor).

Only signal contributions from pixels located just below the touch object are required for touch detection. Signals which deviate from quiet values Vio (when no object is present at the sensor or pixel array) may be used in equation (1) 1 to find the object position Xc. Assuming the object contact area and pixel array pitch are known, the pixel cluster size Nc that is to be processed is defined as the number of pixels in one dimension that required to be processed by the center of gravity or other algorithm to derive a position estimate for a given touch. In one embodiment, a pixel cluster of 3 to 5 pixels (N=Nc) in one dimension is typically sufficient to obtain position estimate Xc, which may be more than ten times more accurate than the results obtained using the pixel array pitch size alone. The signal processing required to encode the position of one object associated with a pixel cluster of Nc size is illustrated by equation (2) below. Initially, the pixel array is assumed to be uniform (non-uniform pixel arrays are discussed in more detail below). In FIG. 5, all distances $S_i$ are equal ($S_1 S$). Equation (1) then reduces to equation (2) as follows:

$$X_C = \frac{S \sum_{i=i_0}^{i_0+N_c} V_i(i - i_0)}{\sum_{i=i_0}^{i_0+N_c} V_i} + X_{i_0} \quad (2)$$

where the center of gravity position estimate employs a reference coordinate of the position corresponding to the leftmost pixel of cluster $X_{i_0}$. While the position of each pixel in touchscreen 90 is determined by touch panel design, the position estimate of the cluster center is algorithm-dependent, and typically requires calibration for appropriate array characterization. A reference position may also be employed to take into account offsets and inaccuracies associated with signal acquisition electronics. In one embodiment of a calibration procedure similar to that employed in reference "dark frame" signal acquisition techniques, it may be required that the deviation of an estimated position when no object is present at the sensor array be compensated for in accordance with the foregoing account offsets and inaccuracies unless such offsets and inaccuracies associated with the touchscreen pixel array and the signal acquisition electronics are negligible.

Figure 6:
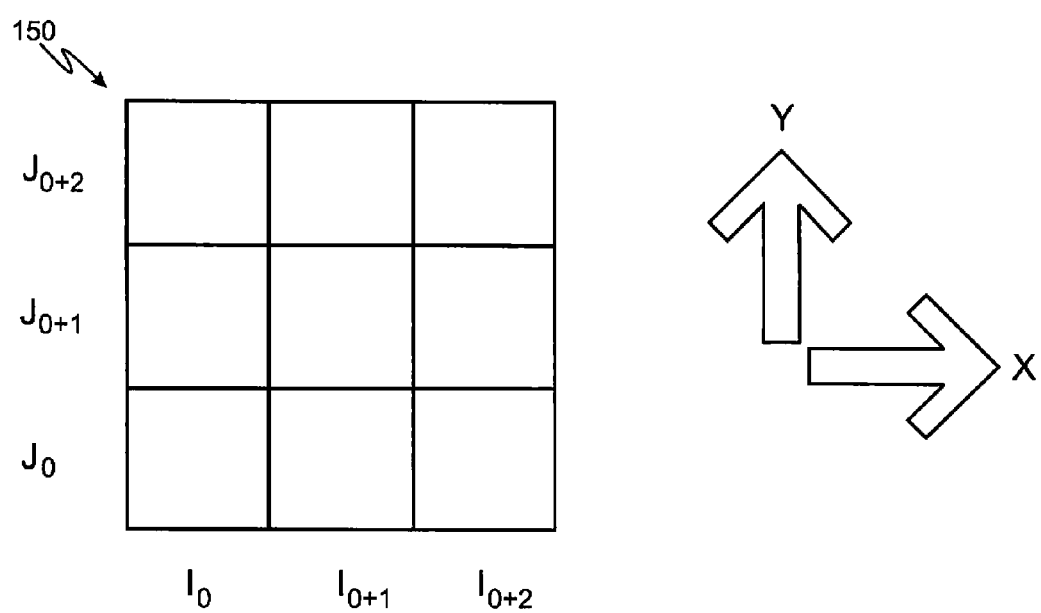
FIG. 6 shows a two-dimensional representation of a pixel cluster.

Two dimensional pixel arrays are processed in manner similar to that described above. One straightforward way to accomplish X-Y cluster processing is to use projections of cluster signals in one dimension (X and Y separately), and to derive coordinates Xc and Yc in a fashion similar to that expressed by equation (2). FIG. 6 shows a two dimensional cluster referenced to a corner pixel with indexes $I_0$, $J_0$. The projections of the cluster of Nc pixels into one dimension are expressed in equations (3) and (4) as follows:

$$V_{PI} = \sum_{k=0}^{k=N_c} V_{I,J+k} \quad (3)$$

$$V_{PJ} = \sum_{k=0}^{k=N_c} V_{I+k,J} \quad (4)$$

so that projections with indexes I and J will be used for corresponding X and Y axis signal processing. To obtain a Y projection, for example, the signals for the pixel cluster may be summed in the X direction for each index. Such a projection processing method is similar to that employed in computed tomography image reconstruction, where projected plane images allow three dimensional reconstruction of an object image. The X-Y projections of the pixel cluster are processed in a manner similar to the cluster projections for one dimension, where the projections associated with the X and Y directions are calculated separately. In a fashion similar to that represented by equation (2), equations (5) and (6) are used to obtain cluster coordinates Xc, Yc as follows:

$$X_C = \frac{S \sum_{I=I_0}^{I_0+N_c} V_{PI}(I - I_0)}{\sum_{I=I_0}^{I_0+N_c} V_{PI}} + X_{I_0} \quad (5)$$

$$Y_C = \frac{S \sum_{J=J_0}^{J_0+N_c} V_{PJ}(J - J_0)}{\sum_{J=J_0}^{J_0+N_c} V_{PJ}} + Y_{J_0} \quad (6)$$

where the denominators represent the sum of the processed individual cluster signals. Such cluster projections also may be formed during signal acquisition, as discussed above.

The Encoding Principle

The most common way to process signals from a pixel array is to digitize each pixel sensor signal from touchscreen 90, and to further process the digital to codes acquired at from different drive lines by means of digital filtering. The digitization procedure with N bit analog to digit converter (ADC) is formally described by equation (7) as follows:

$$D[V_i] = IntegerPart\left[2^N \frac{V_i}{V_{ref}}\right] = b_0 2^0 + b_1 2^1 + \ldots + b_{N-1} 2^{N-1} \quad (7)$$

where 0 represents the digitization operation. The division result in equation (7) is formed for each input signal Vi using the value of the least significant bit (LSB). The LSB analog value may be generated using a stable reference Vref calculated as LSB=Vref/2". The division result is disentangled into a sum of binary weighted bit states $b_0$ to $b_{N-1}$ ($b_1$ are equal to 1 or 0). A multiplicative ADC assumes that the LSB size follows the analog reference value Vref. This property of the ADC may be used to generate a binary code for the center of gravity estimate of the pixel cluster, which corresponds to a touch detected on the pixel sensor array (touchscreen 90). In accordance with the above principle, the ADC may digitize a weighted sum of pixel cluster signals, and use a non-weighted sum of pixel cluster signals of the cluster as an analog reference for the ADC conversion. For example, a center of gravity binary code for the pixel cluster may be obtained using as a reference or datum a position of the left-most pixel of the pixel cluster. In a manner similar to that represented by equation (7), a binary code for the cluster position may be obtained in equation (8) as follows:

$$D[X_C] = IntegerPart\left[2^N \frac{\sum_{i=i_0}^{i_0+N_c} V_i(i-i_0)}{\sum_{i=i_0}^{i_0+N_c} V_i}\right] \quad (8)$$

where Vref of equation (7) is replaced by a sum of signals associated with the pixel cluster, while a weighted sum of the same signals is used as an input for the ADC.

In the case of a two-dimensional pixel cluster, the projections of cluster signals $V_{PI}$, $V_{PJ}$ from equations (3) and (4) may be used instead of signals Vi.

In the case of a single-dimensional pixel cluster size of three (Nc=3), equation (8) may be transformed into a practical implementation in accordance with equation (9) as follows:

$$D[X_C] = IntegerPart\left[2^N \frac{V_{i_0+1} + 2V_{i_0+2}}{V_{i_0} + V_{i_0+1} + V_{i_0+2}}\right] \quad (9)$$

The digital codes of position estimates are generated directly at the ADC output. Multiplication of the analog signals at the ADC converter input by constants (such as 1 and 2 for a cluster size of 3) may be accurately implemented in the integrated circuit using matched capacitors. Knowledge of the object size (such as the size of a finger or stylus) with respect to pixel size allows elimination of position interpolation bias introduced by the center of gravity algorithm through the use of post-processing raw position estimation. Subsequent digital filtering to increase signal-to-noise ratios is similar to single-pixel signal filtering.

Integrated Circuit Implementation

Figure 7:
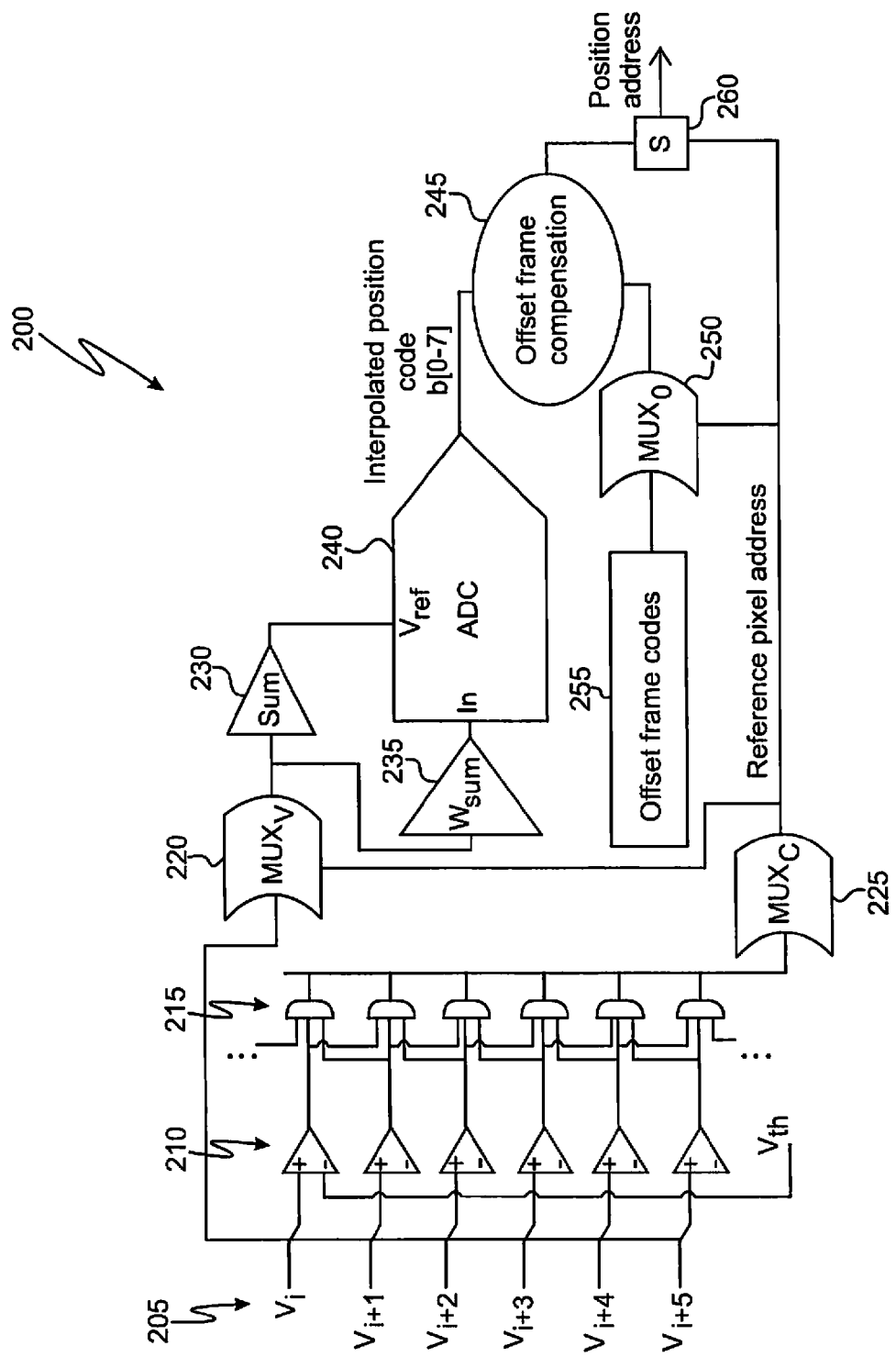
FIG. 7 shows one embodiment of an analog-to-digital converter (ADC) position encoding circuit.

One embodiment of circuit 300 which encodes touch positions using signals acquired from a linear array (i.e., one projection) is shown in FIG. 7. In the below discussion regarding circuit 200, a touch is represented by a pixel cluster size of 3, although larger pixel clusters may be processed similarly. Acquired analog signals Vi (205) are compared against a predetermined threshold potential $V_{th}$. When three neighboring signals exceed the threshold, an address of the pixel cluster corresponding to the detected touch is decoded using a coincidence circuit (i.e., the three input logical AND circuit 215 of FIG. 7) and digital decoder circuit MUXc (225). In a simple version of circuit 200, the detection of just one signal exceeding a high threshold is illustrated. The output code of MUXc (225) is employed to decode the analog signals corresponding to the pixel cluster, and to present to the position encoding circuit (ADC 240) signals Vi through MUXv (220). Prior to beginning the ADC process, an analog sum of Vi signals for the pixel cluster is formed in Sum module 230 (which corresponds to the denominator of equation (9)), while an analog sum for the weighted signals is formed in Wsum module (235) (which corresponds to the nominator of equation (9)). Supplementary additions to the encoding principles described herein may include corrections of encoded positions using reference information. For example, if the pixel array of touchscreen 90 is not uniform, the code for a particular encoded position may be corrected using "dark frame" codes generated when no object is present on the pixel array of touchscreen 90. Such corrections may be accomplished with arithmetic operations performed in offset frame compensation module 245 of FIG. 7. The memorized compensation code is presented to offset compensation module 245 using the cluster address decoded in MUXc (225) by decoding memorized "dark frame" codes in $MUX_0$ (250). A cluster reference code (the pixel code generated at the output of MUXc (225)) and the compensated position interpolation codes fully characterize the encoded position of the touch object. Multiple clusters may be processed using First-In/First-Out principles. Component matching and calibration accuracy with reference frame codes (when they are used) determine position encoding accuracy. In FIG. 7, pixel signal information is acquired for the whole pixel array or touchscreen 90 using projections over X lines.

Figure 8:
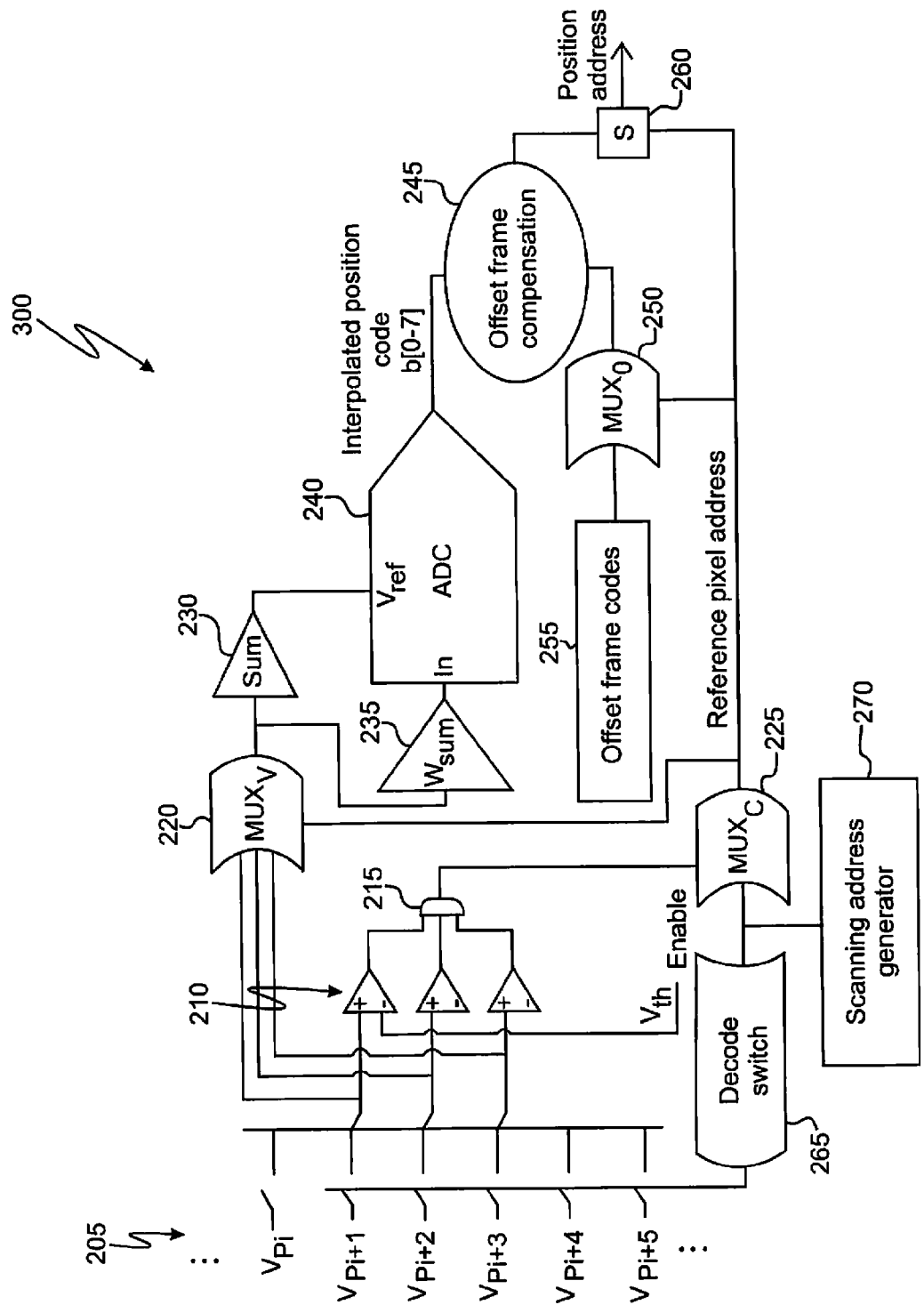
FIG. 8 shows another embodiment of an analog-to-digital converter (ADC) position encoding circuit.

An alternative approach employing a sliding coincidence circuit having the number of inputs equal to the cluster size may also be used, as shown in circuit 300 of FIG. 8. With drive lines disposed along the Y direction and charge data acquired along X lines, cluster selection circuit 210 may be reused for many inputs as shown in FIG. 4. Touch detection is realized by supplying codes from scanning address generator 270, which multiplexes voltage potentials corresponding to X line signals stored in charge acquisition circuits, and which are presented to the inputs of the comparators in circuit 210. The detection of touch coincidences enables cluster addresses to be propagated, which permits the position encoding process to begin as described above.

Evaluation Through Simulations

Figure 9:
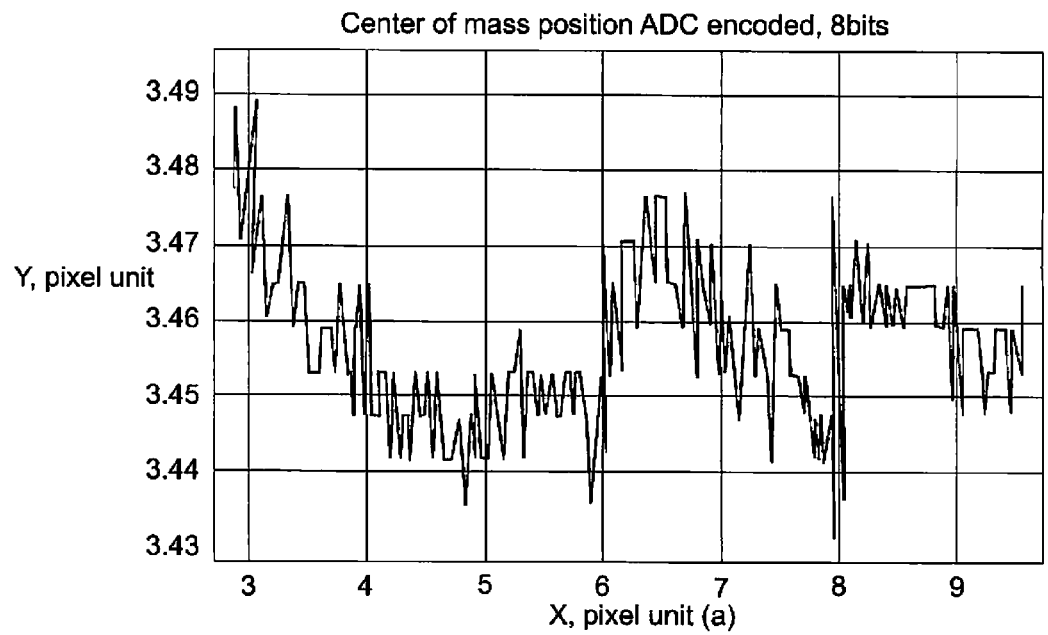
FIGS. 9 and 10 show simulated pixel array X,Y trajectories obtained in accordance with one embodiment.
Figure 10:
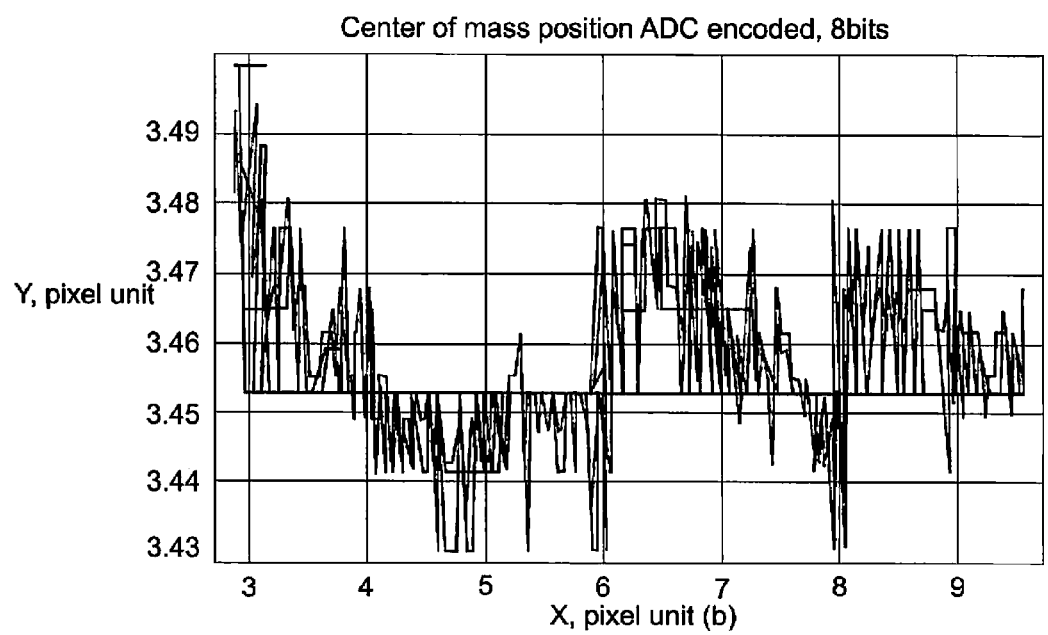
Figure 11:
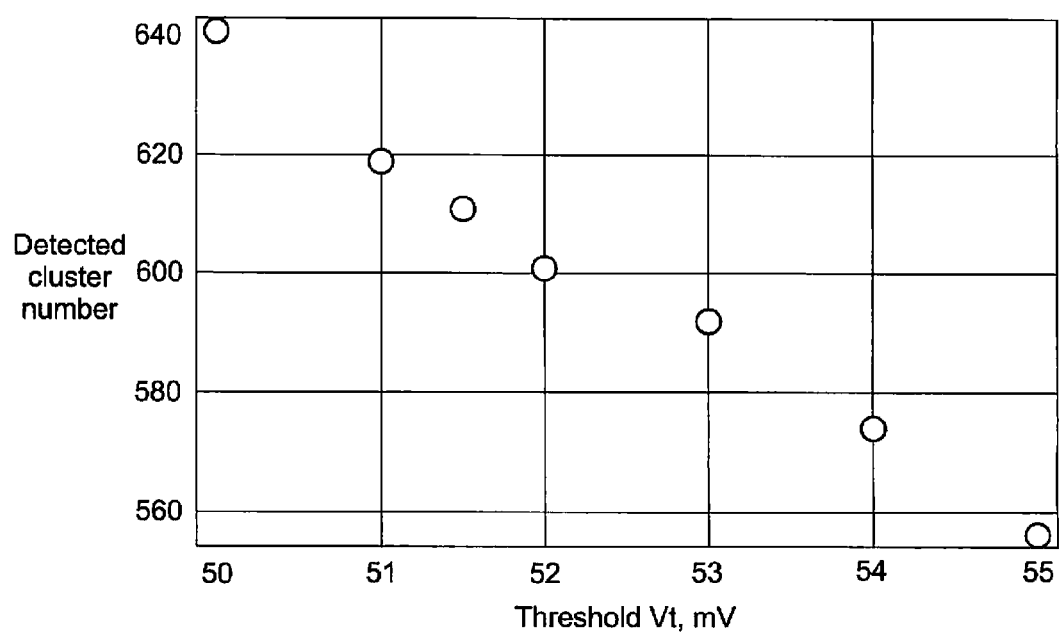
FIG. 11 shows the variation in the detected number of clusters versus comparator threshold voltages.

An illustrative encoding algorithm was modeled, and its functionality evaluated, in simulations employing raw frames of data acquired from a 12×8 capacitive sensor array. An object emulating a finger was moved across the array. For each frame, non-filtered data were digitized using an 8 bit ADC, and a search for a pixel cluster of 3×3 pixels was performed. Once detected, the pixel cluster was processed using the projection method described above, with position encoding being provided by the aforementioned center of gravity algorithm. Each detected pixel cluster position was referenced to pixel array using pixel coordinates (or line numbers). FIGS. 9 and 10 show encoded trajectory plots, where input data are represented as analog signals with "dark frames" having been removed therefrom. A simulated trajectory over the pixel array was obtained using touch pixel cluster extraction, where detected signals exceeded a threshold of 52 mV. The successively derived position coordinates are shown in the X-Y plots of FIGS. 9 and 10, where the units on the displayed graphs correspond to individual pixel sizes. FIG. 9 shows an encoded trajectory plot derived from frame data using position encoding with an 8 bit ADC. FIG. 10 shows a comparison of trajectories encoded with 8, 7, 6 and 5 bit ADCs. FIG. 10 shows that the greater the number bits employed, the more accurate the encoded trajectories become. The efficiency of pixel cluster selection using a single threshold was evaluated using raw data corresponding to 604 frames for the simulated moving object. The fraction of frames where pixel clusters were not detected was measured against comparator threshold values. FIG. 11 shows the variation in the detected number of clusters versus comparator threshold voltages, and illustrates that a 5 mV threshold variation above a correct value results in a 5% loss of touch detection when cluster detection is carried out using a single threshold. A change in cluster detection efficiency noise added thereto may be estimated on the basis of data similar to that shown in FIG. 11.

Note that the various teachings presented herein may be applied to optically transmissive or non-optically-transmissive touchpads disposed, for example, on a printed circuit board, a flex board or other suitable substrate. While the primary use of capacitive touchscreen 90 is believed likely to be in the context of relatively small portable devices, and touchpads or touchscreens therefore, it may also be of value in the context of larger devices, including, for example, keyboards associated with desktop computers or other less portable devices such as exercise equipment, industrial control panels, household appliances, and the like. Similarly, while many embodiments of the invention are believed most likely to be configured for manipulation by a user's fingers, some embodiments may also be configured for manipulation by other mechanisms or body parts. For example, the invention might be located on or in the hand rest of a keyboard and engaged by the heel of the user's hand. Furthermore, various embodiments of capacitive touchscreen system 110 and capacitive touchscreen 90 are not limited in scope to drive electrodes disposed in rows and sense electrodes disposed in columns. Instead, rows and columns are interchangeable in respect of sense and drive electrodes. Various embodiments various embodiment of capacitive touchscreen system 110 and capacitive touchscreen 90 are also capable of operating in conjunction with a stylus, such that stylus touches on touchscreen 90 are detected. System 110 and touchscreen 90 may further be configured to permit the detection of both of finger touches and stylus touches.

Note further that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

I claim:

1. A capacitive touchscreen system, comprising:
a touchscreen comprising a first plurality of electrically conductive drive traces and a second plurality of electrically conductive sense traces, mutual capacitances existing between the first and second pluralities of traces at locations where the first and second pluralities of traces intersect to form pixels, such mutual capacitances changing in the presence of one or more fingers or touch devices brought into proximity thereto;
drive circuitry operably connected to the first plurality of drive traces;
sense circuitry operably connected to the second plurality of sense traces and comprising charge acquisition circuitry, the sense circuitry being configured to sense the mutual capacitances along each of the second plurality of sense traces and to generate a plurality of sense voltages corresponding to the sense traces;
a plurality of comparators configured to receive as inputs thereto a threshold voltage and the sense voltages, the comparators providing comparator output signals;
an analog multiplexer having as a first input thereto the sense voltages;
a plurality of logical AND gates configured to receive as inputs thereto the comparator output signals and to provide as outputs therefrom logical AND output signals, the AND output signals being inputs to a digital multiplexer operably connected to the outputs of the plurality of logical AND gates, the analog multiplexer receiving as a digital input thereto a digital output of the digital multiplexer;
a first sum circuit configured to receive as an input thereto an output from the analog multiplexer and to provide as an output therefrom an analog-to-digital converter (ADC) reference voltage representing a sum of the sense voltages corresponding to at least one cluster of pixels associated with at least one sensed touch on the touchscreen;
a second weighted sum circuit configured to receive as an input thereto the output from the analog multiplexer and to provide as an output therefrom an input to the ADC representing a weighted sum of the sense voltages corresponding to pixels of the cluster;
wherein the outputs of the comparators and the AND gates represent at least one cluster of pixels corresponding to at least one sensed touch on the touchscreen, the output of the second weighted sum circuit represents a weighted sum of the sense voltages corresponding to pixels of the cluster, and the ADC generates as an output therefrom a position code corresponding to an interpolated location of the sensed finger or device touch.

2. The capacitive touchscreen system of claim 1, wherein the position code output from the ADC is provided to an offset frame compensation circuit as a first input thereto.

3. The capacitive touchscreen system of claim 2, wherein the offset frame compensation circuit receives as a second input thereto no-touch data.

4. The capacitive touchscreen system of claim 3, wherein the no-touch data are generated using the output from the second multiplexer as a first input to a third multiplexer and offset frame codes as a second input to the third multiplexer, the third multiplexer providing as an output therefrom the no-touch data.

5. The capacitive touchscreen system of claim 4, wherein the no-touch data are provided as an input to the offset frame compensation circuit.

6. The capacitive touchscreen system of claim 1, further comprising a decode switch circuit having an output operably connected to control terminals of switches, the switches being operably connected to inputs of the plurality of comparators.

7. The capacitive touchscreen system of claim 1, wherein an input of the decode switch circuit is operably connected to the input of the second multiplexer.

8. The capacitive touchscreen system of claim 7, further comprising a scanning address generator operably connected to the input of the decode switch circuit and to the input of the second multiplexer.

9. The capacitive touchscreen system of claim 1, wherein the pixel cluster is a cluster of 2×2 pixels.

10. The capacitive touchscreen system of claim 1, wherein the pixel cluster is a cluster of 3×3 pixels.

11. The capacitive touchscreen system of claim 1, wherein the pixel cluster is a cluster of 4×4 pixels.

12. The capacitive touchscreen system of claim 1, wherein the pixel cluster is a cluster of 5×5 pixels.

13. The capacitive touchscreen system of claim 1, wherein the interpolated location of the sensed touch is determined using a center of gravity algorithm implemented in hardware circuitry of the ADC.

14. A method of encoding detected touch or object positions in an analog-to-digital converter (ADC) included in a capacitive touchscreen system, comprising:
providing drive signals to a first plurality of electrically conductive drive traces, a second plurality of electrically conductive sense traces being located in proximity to the first plurality of drive traces such that mutual capacitances are developed between the first and second pluralities of traces at locations where the first and second pluralities of traces intersect to form pixels, such mutual capacitances changing in the presence of one or more fingers or touch devices brought into proximity thereto;
sensing of the mutual capacitances along each of the second plurality of sense traces and generating a plurality of sense voltages corresponding to each of the sense traces;
providing a threshold voltage and the sense voltages to a plurality of comparators as inputs thereto, the comparators providing comparator output signals, the comparators receiving the input sense voltages as multiplexed input signals under the control of a first multiplexer operably connected to the plurality of comparators;
providing the comparator output signals to a plurality of AND gates configured as inputs thereto and generating as outputs from the AND gates AND output signals, the AND output signals being multiplexed under control of a second multiplexer operably connected to the outputs of the plurality of AND gates, the first multiplexer receiving as an input thereto an output of the second multiplexer;
providing to a first sum circuit as an input thereto an output from the first multiplexer, the first sum circuit generating as an output therefrom an ADC reference voltage;
providing to a second weighted sum circuit as an input thereto the output from the first multiplexer and generating as an output therefrom an input to the ADC;
wherein the outputs of the comparators and the AND gates represent at least one cluster of pixels corresponding to at least one sensed finger or device touch on the touchscreen, the output of the second weighted sum circuit represents a weighted sum of the sense voltages corresponding to pixels of the cluster, the ADC generating as an output therefrom a position code corresponding to an interpolated location of the sensed object or touch.

15. The method of claim 14, further comprising providing the position code output from the ADC to an offset frame compensation circuit as a first input thereto.

16. The method of claim 15, further comprising providing a second input to the offset frame compensation circuit representative of no-touch data.

17. The method of claim 14, further comprising generating no-touch data using the output from the second multiplexer as a first input to a third multiplexer and offset frame codes as a second input to the third multiplexer, the third multiplexer providing as an output therefrom the no-touch data.

18. The method of claim 17, further comprising providing the no-touch data as an input to the offset frame compensation circuit.

19. The method of claim 14, further comprising operably connecting an output of a decode switch to control terminals of switches, the switches being operably connected to inputs of the plurality of comparators.

20. The method of claim 19, further comprising operably connecting an input of the decode switch circuit to an input of the second multiplexer.

21. The method of claim 20, further comprising operably connecting a scanning address generator to the input of the decode switch circuit and to the input of the second multiplexer.

22. The method of claim 14, further comprising providing a pixel cluster of 2×2 pixels.

23. The method of claim 14, further comprising providing a pixel cluster of 3×3 pixels.

24. The method of claim 14, further comprising providing a pixel cluster of 4×4 pixels.

25. The method of claim 14, further comprising providing a pixel cluster of 5×5 pixels.

26. The method of claim 14, further comprising determining the interpolated location of the sensed touch using a center of gravity algorithm implemented in hardware circuitry of the ADC.

* * * * *